(12) United States Patent  
Son (10) Patent No.: US 11,328,871 B2  
(45) Date of Patent: May 10, 2022

(54) COMPOSITE ELECTRONIC COMPONENT

(71) Applicant: SAMSUNG ELECTRO-MECHANICS CO., LTD., Suwon-si (KR)

(72) Inventor: Soo Hwan Son, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 109 days.

(21) Appl. No.: 16/872,676

(22) Filed: May 12, 2020

(65) Prior Publication Data

US 2021/0159016 A1 May 27, 2021

(30) Foreign Application Priority Data

Nov. 25, 2019 (KR) .................. 10-2019-0152178

(51) Int. Cl.
*H01G 4/30* (2006.01)
*H01G 4/012* (2006.01)
(Continued)

(52) U.S. Cl.
CPC .............. *H01G 4/30* (2013.01); *H01G 4/012* (2013.01); *H01G 4/1209* (2013.01); *H01G 4/248* (2013.01)

(58) Field of Classification Search
CPC ............ H01G 4/232; H01G 4/40; H01G 4/30; H01G 4/012; H01G 4/1209; H01G 4/248; H01G 4/32
See application file for complete search history.

(56) References Cited

U.S. PATENT DOCUMENTS 10,483,040 B1 11/2019 Kim et al.
2014/0198427 A1* 7/2014 Kamobe .............. H01G 4/2325
361/301.4
(Continued)

FOREIGN PATENT DOCUMENTS

JP 5012658 B2 6/2012
JP 2014-86606 A 5/2014
(Continued)

OTHER PUBLICATIONS

Office Action issued in corresponding Korean Patent Application No. 10-2019-0152178 dated Feb. 23, 2021, with English translation.

*Primary Examiner* — Michael P McFadden
(74) *Attorney, Agent, or Firm* — Morgan, Lewis & Bockius LLP (57) ABSTRACT

A composite electronic component includes a composite body including a multilayer ceramic capacitor and a ceramic chip coupled to each other. The multilayer ceramic capacitor includes a first ceramic body and first and second external electrodes, and the ceramic chip is disposed below the multilayer ceramic capacitor and includes a second ceramic body having first and second terminal electrodes. The multilayer ceramic capacitor and the ceramic chip are coupled by solder disposed between the first and second external electrodes and the first and second terminal electrodes, and each angle (θ) defined by inner side surfaces of the solder, respectively disposed on inner ends of bent portions of the first and second terminal electrodes disposed on an upper surface of the second ceramic body, and an upper plane of the second ceramic body of the ceramic chip satisfies 45 degrees or less.

16 Claims, 4 Drawing Sheets

(51) Int. Cl.
*H01G 4/12* (2006.01)
*H01G 4/248* (2006.01)

(56) References Cited

U.S. PATENT DOCUMENTS

| | | |
|---|---|---|
| 2015/0041195 A1 | 2/2015 | Ahn et al. |
| 2015/0270068 A1* | 9/2015 | Hattori .................... H01C 1/14 |
| | | 361/301.4 |
| 2016/0007446 A1* | 1/2016 | Ishikawa .................. H01G 4/30 |
| | | 174/260 |
| 2016/0381802 A1* | 12/2016 | Taniguchi ............ H05K 1/0243 |
| | | 174/260 |
| 2018/0082784 A1* | 3/2018 | Akiyoshi ............... H05K 3/305 |
| 2020/0118744 A1 | 4/2020 | Sim et al. |

FOREIGN PATENT DOCUMENTS

| | | |
|---|---|---|
| KR | 10-2015-0018208 A | 2/2015 |
| KR | 10-2019-0121206 A | 10/2019 |
| KR | 10-2032759 B1 | 10/2019 |

* cited by examiner

COMPOSITE ELECTRONIC COMPONENT

CROSS-REFERENCE TO RELATED APPLICATION(S)

The present application claims the benefit of priority to Korean Patent Application No. 10-2019-0152178 filed on Nov. 25, 2019 in the Korean Intellectual Property Office, the disclosure of which is incorporated herein by reference in its entirety.

BACKGROUND

1. Field

The present disclosure relates to a composite electronic component.

2. Description of Related Art

A multilayer ceramic capacitor, a multilayer electronic component, is a chip type condenser mounted on the circuit boards of various electronic products including an image display device, such as, for example, a liquid crystal display (LCD), a plasma display panel (PDP), and the like, as well as a computer, a personal digital assistant (PDA), a cellular phone, and the like, serving to charge or discharge electricity therein or therefrom.

The multilayer ceramic capacitor (MLCC) may be used as a component of various electronic apparatuses, since it has a small size, implements high capacitance, and is easily mounted.

The multilayer ceramic capacitor may have a structure including a plurality of dielectric layers, and internal electrodes alternately stacked between the dielectric layers and having different polarities.

Since the dielectric layers have piezoelectric and piezoresistive characteristics, a piezoelectric phenomenon may occur between the internal electrodes when a direct current (DC) or alternating current (AC) voltage is applied to the multilayer ceramic capacitor, such that vibrations may be generated therein.

These vibrations are transferred to the circuit board on which the multilayer ceramic capacitor is mounted through external electrodes of the multilayer ceramic capacitor, such that the entirety of the circuit board becomes a sound reflecting surface to generate vibration sound, known as noise.

The vibration sound may correspond to an audio frequency in a range of 20 to 20,000 Hz causing listener discomfort. The vibration sound causing listener discomfort as described above is known as acoustic noise.

Recently, acoustic noise has appeared on a level at which it may be sufficiently recognized by a user as an electronic device is used together with a printed circuit board in an environment in which a voltage is high and a change in the voltage is large, in accordance with recent slimming and miniaturization of the electronic device.

Therefore, a new product in which acoustic noise is decreased has been continuously demanded.

Meanwhile, a composite electronic component in which a ceramic chip is used on a lower surface of a multilayer ceramic capacitor in order to decrease acoustic noise has been studied.

However, when the multilayer ceramic capacitor is bonded to an upper surface of the ceramic chip, it may be important to ensure that the multilayer ceramic capacitor is correctly bonded in a predetermined position.

Accordingly, research on a method of aligning the positions of the multilayer ceramic capacitors depending on the shape of the ceramic chips and terminal electrodes disposed on the lower surface of the multilayer ceramic capacitor has been required.

SUMMARY

An aspect of the present disclosure is to provide a composite electronic component that may reduce acoustic noise, and excellent alignment of a multilayer ceramic capacitor.

According to an aspect of the present disclosure, a composite electronic component includes a composite body including a multilayer ceramic capacitor and a ceramic chip coupled to each other.

The multilayer ceramic capacitor includes a first ceramic body having a plurality of dielectric layers and internal electrodes, stacked to face each other with each of the respective dielectric layers interposed therebetween, and further includes first and second external electrodes disposed on opposite end portions of the first ceramic body, respectively, in a first direction.

The ceramic chip is disposed below a lower surface of the first ceramic body of the multilayer ceramic capacitor in a second direction and includes a second ceramic body and first and second terminal electrodes disposed on opposite end portions of the second ceramic body, respectively, in the first direction and connected to the first and second external electrodes, respectively.

Solder is arranged between the first external electrode and the first terminal electrode and between the second external electrode and the second terminal electrode such that the multilayer ceramic capacitor and the ceramic chip are coupled. The solder includes first portions respectively disposed on inner ends of bent portions of the first and second terminal electrodes disposed on an upper surface of the second ceramic body facing the lower surface of the first ceramic body.

Each angle (θ) defined by inner sider surfaces of the first portions of the solder and the upper surface of the second ceramic body satisfies 45 degrees or less.

According to another aspect of the present disclosure, a composite electronic component includes a composite body including a multilayer ceramic capacitor and a ceramic chip coupled to each other The multilayer ceramic capacitor includes a first ceramic body having a plurality of dielectric layers and internal electrodes, stacked to face each other with the respective dielectric layers interposed therebetween, and further includes first and second external electrodes disposed on opposite end portions of the first ceramic body, respectively, in a first direction.

The ceramic chip is disposed below a lower surface of the first ceramic body of the multilayer ceramic capacitor and includes a second ceramic body and first and second terminal electrodes disposed on opposite end portions of the second ceramic body in the first direction, respectively, and connected to the first and second external electrodes, respectively, wherein, when 'C1' is a distance in the first direction from a central plane of the composite body to inner ends of bent portions of the first and second external electrodes disposed on the lower surface of the first ceramic body, 'C2' is a distance in the first direction from the central plane of the composite body to inner ends of bent portions of the first and second terminal electrodes disposed on an upper surface of the second ceramic body facing the lower surface of the first ceramic body, and 'G1' is a distance between the first ceramic body and the second ceramic body in the second direction, (C1-C2)>G1.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Embodiments of the present disclosure may be modified to have various other forms, and the scope of the present disclosure is not limited to the embodiments described below. Embodiments of the present disclosure may be also provided to more fully describe the present disclosure to those skilled in the art. Therefore, the shapes and sizes of the elements in the drawings may be exaggerated for clarity, and elements denoted by the same reference numerals in the drawings may be the same elements.

Composite Electronic Component

Hereinafter, a preferred exemplary embodiment of the present disclosure with reference to the accompanying drawings will be described.

Figure 1:
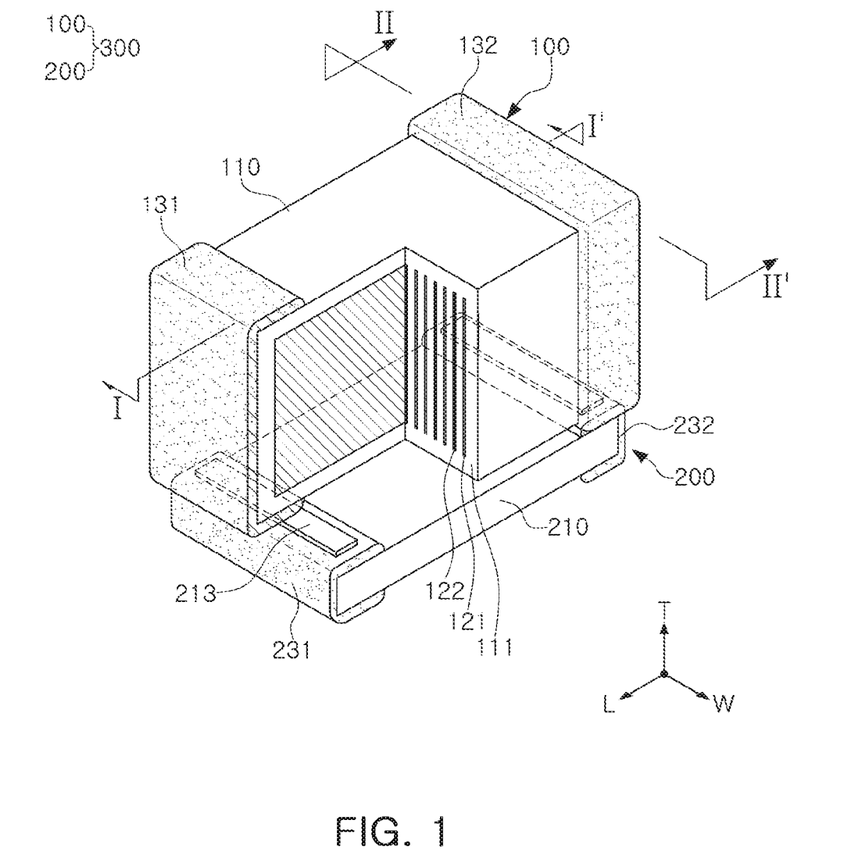
FIG. 1 is a schematic perspective view illustrating a composite electronic component according to a first exemplary embodiment of the present disclosure.

FIG. 1 is a schematic perspective view illustrating a composite electronic component according to a first exemplary embodiment of the present disclosure.

Figure 2:
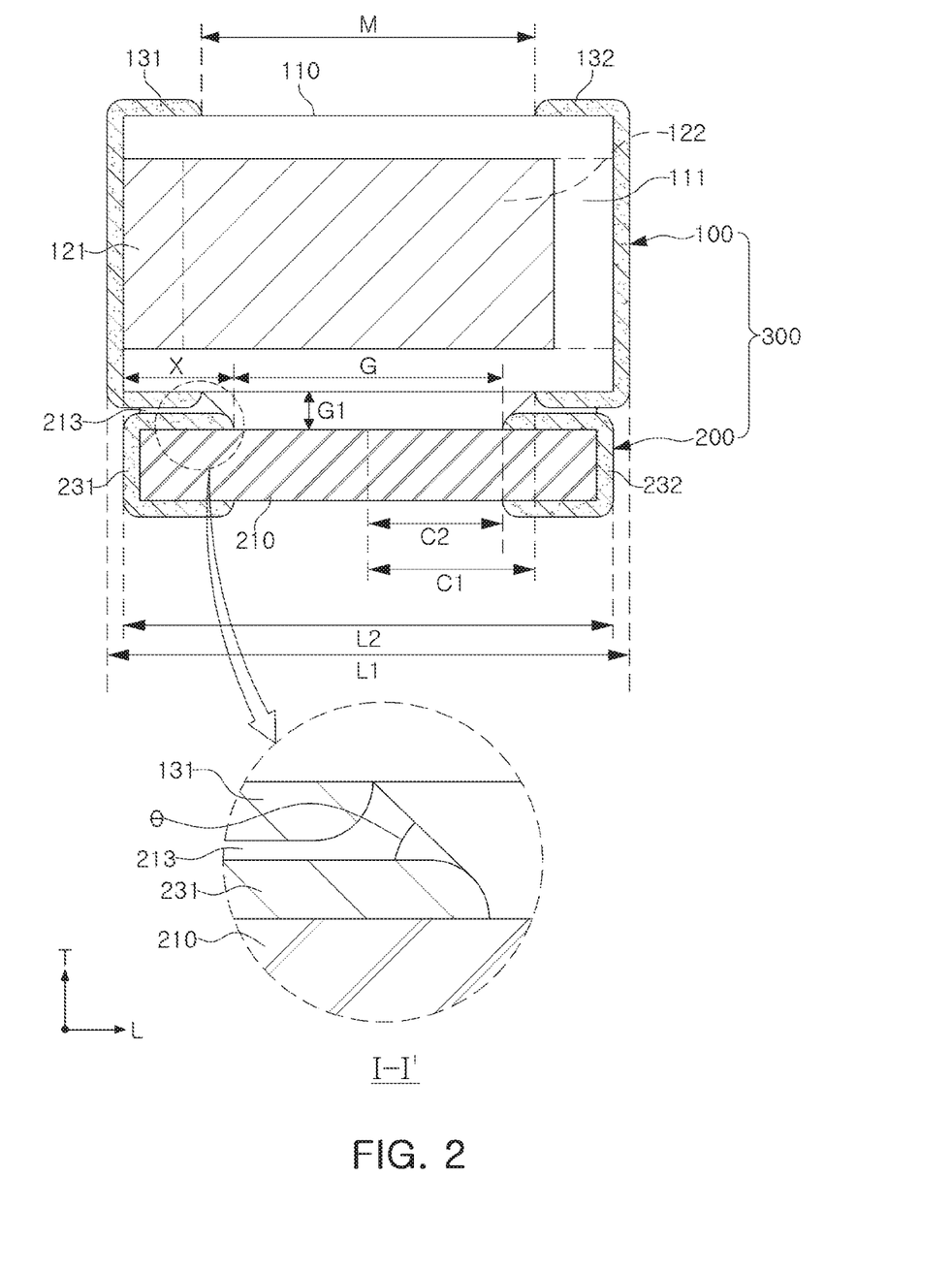
FIG. 2 is a cross-sectional view taken along line I-I' of FIG. 1.

FIG. 2 is a cross-sectional view taken along line I-I' of FIG. 1.

Figure 3:
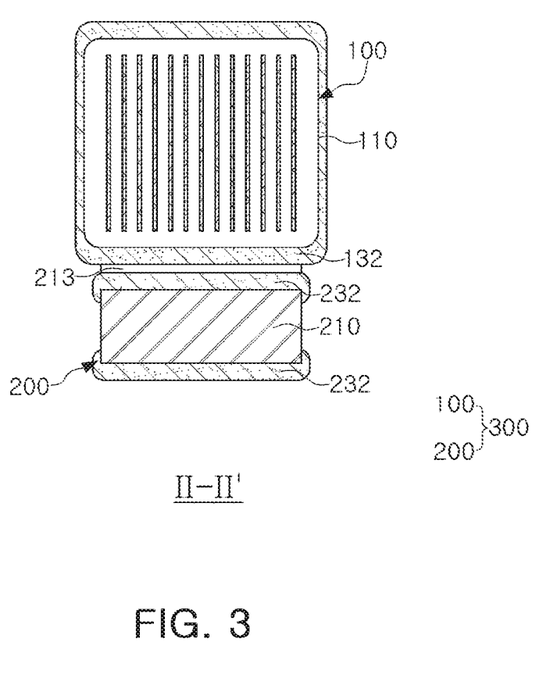
FIG. 3 is a cross-sectional view taken along line II-II' of FIG. 1.

FIG. 3 is a cross-sectional view taken along line II-II' of FIG. 1.

Referring to FIG. 1, in the composite electronic component according to an exemplary embodiment of the present disclosure, a 'length direction' refers to an 'L' direction (or 'first direction') of FIG. 1, a 'thickness direction' refers to a 'T' direction (or 'second direction') of FIG. 1, and a 'width direction' refers to a 'W' direction (or 'third direction') of FIG. 1. In this case, the 'thickness direction' may be used as having the same concept as a direction in which dielectric layers of a capacitor are stacked, that is, a 'stacking direction.'

Meanwhile, in an exemplary embodiment of the present disclosure, the composite electronic component may have upper and lower surfaces opposing each other, first and second side surfaces connecting the upper and lower surfaces in the length direction, and third and fourth side surfaces connecting the upper and lower surfaces in the width direction. A shape of the composite electronic component is not particularly limited, and may be a hexahedral shape, as illustrated.

In addition, the first and second side surfaces of the composite electronic component in the length direction and the third and fourth side surfaces thereof in the width direction may be the same as first and second side surfaces of a multilayer ceramic capacitor and a ceramic chip in the length direction and third and fourth side surfaces thereof in the width direction, respectively, as described below.

Meanwhile, the composite electronic component may have a form in which the multilayer ceramic capacitor and the ceramic chip are coupled to each other, and when the ceramic chip is coupled to a lower portion of the multilayer ceramic capacitor, an upper surface of the composite electronic component may refer to an upper surface of the multilayer ceramic capacitor, and a lower surface of the composite electronic component may refer to a lower surface of the ceramic chip.

Referring to FIGS. 1 and 2, a composite electronic component according to an exemplary embodiment of the present disclosure may include a composite body 300 including a multilayer ceramic capacitor 100 and a ceramic chip 200 coupled to each other. The multilayer ceramic capacitor 100 includes a first ceramic body 110 having a plurality of dielectric layers 111 and internal electrodes 121 and 122 stacked to face each other with the respective dielectric layers 111 interposed therebetween are stacked, and further includes first and second external electrodes 131 and 132 disposed on opposite end portions of the first ceramic body 110, respectively, in the length direction. The ceramic chip 200 is disposed below a lower surface of the first ceramic body 110 of the multilayer ceramic capacitor 100 in the thickness direction and includes a second ceramic body 210 including ceramic and first and second terminal electrodes 231 and 232 disposed on opposite end portions of the second ceramic body 210, respectively, in the length direction and connected to the first and second external electrodes 131 and 132, respectively.

The ceramic may include alumina ($Al_2O_3$).

Generally, there has been an attempt to insert an intermediate medium between a multilayer ceramic capacitor and a printed circuit board in order to suppress vibrations of the multilayer ceramic capacitor from being transferred to the printed circuit board.

The intermediate medium, generally a resin used to manufacture the printed circuit board, may be formed of a material having elasticity, and may thus serve to absorb the vibrations of the multilayer ceramic capacitor by elasticity thereof.

According to the first exemplary embodiment of the present disclosure, since the second ceramic body 210 of the ceramic chip 200 is only formed of a ceramic including hard alumina ($Al_2O_3$) that is not elastically deformed, the printed circuit board and the multilayer ceramic capacitor 100 may be spaced apart from each other by the ceramic chip 200. Therefore, the transfer of vibrations themselves generated by the multilayer ceramic capacitor 100 may be blocked.

According to an exemplary embodiment of the present disclosure, the multilayer ceramic capacitor 100 and the ceramic chip 200 may be coupled by solder 213 disposed between the first and second external electrodes 131 and 132 and the first and second terminal electrodes 231 and 232, and an angle (θ) formed by the solder 213 disposed on inner ends of bent portions of the first and second terminal electrodes 231 and 232 disposed on an upper surface of the second ceramic body 210, and an upper plane of the second ceramic body 210 of the ceramic chip 200 may satisfy 45 degrees or less.

Conventionally, a composite electronic component in which a ceramic chip is used on a lower surface of a multilayer ceramic capacitor in order to decrease acoustic noise has been studied.

However, when a multilayer ceramic capacitor is coupled on an upper surface of a ceramic chip, it may be important to ensure that the multilayer ceramic capacitor is correctly coupled in a predetermined position.

Accordingly, research on a method of aligning the positions of the multilayer ceramic capacitors depending on the shape of the ceramic chips and terminal electrodes disposed on the lower surface of the multilayer ceramic capacitor has been required.

In the course of studying the present disclosure, in order to precisely align a position of a multilayer ceramic capacitor in a central portion of a composite electronic component, it has been found that a shape of a ceramic chip, a shape of a terminal electrode disposed on the ceramic chip, and a shape of solder coupling the multilayer ceramic capacitor to the ceramic chip may affect the alignment of the position of the multilayer ceramic capacitor.

For example, the terminal electrode of the ceramic chip may be located closer to the central portion of the composite electronic component than the external electrode of the multilayer ceramic capacitor based on the central portion of the composite electronic component, and surface tension may be generated while melting the solder paste bonding the multilayer ceramic capacitor and the ceramic chip at a predetermined temperature or higher, to maximize the effect of the alignment of the multilayer ceramic capacitor disposed on the upper portion.

Specifically, in the first exemplary embodiment of the present disclosure, the multilayer ceramic capacitor 100 and the ceramic chip 200 may be coupled by solder 213 disposed between the first and second external electrodes 131 and 132 and the first and second terminal electrodes 231 and 232, and an angle (θ) formed by the solder 213 disposed on inner ends of bent portions of the first and second terminal electrodes 231 and 232 disposed on an upper surface of the second ceramic body 210, and an upper plane of the second ceramic body 210 of the ceramic chip 200 may be controlled to satisfy 45 degrees or less, to maximize an effect of aligning the multilayer ceramic capacitor disposed on the ceramic chip to the central portion.

When the angle (θ) formed by the solder 213 disposed on the inner ends of the bent portions of the first and second terminal electrodes 231 and 232 disposed on the upper surface of the second ceramic body 210, and the upper plane of the second ceramic body 210 of the ceramic chip 200 satisfies 45 degrees or less, the surface tension generated while melting the solder 213 coupling the multilayer ceramic capacitor 100 and the ceramic chip 200 at a predetermined temperature or higher may increase.

Therefore, the surface tension generated while melting the solder 213 may increase, to stably align the multilayer ceramic capacitor in the central portion without being distorted.

When the angle (θ) formed by the solder 213 disposed on the inner ends of the bent portions of the first and second terminal electrodes 231 and 232 disposed on the upper surface of the second ceramic body 210, and the upper plane of the second ceramic body 210 of the ceramic chip 200 exceeds 45 degrees, the multilayer ceramic capacitor disposed on the ceramic chip may be distorted, without increasing the surface tension generated by the solder.

As such, when the multilayer ceramic capacitor disposed on the ceramic chip is disposed in a distorted state, problems may occur in reducing the acoustic noise, and failures may occur in mounting the composite electronic component.

The composite body 300 may be formed by coupling the multilayer ceramic capacitor 100, separately manufactured, and the ceramic chip 200 using the solder 213, a conductive adhesive, or the like.

The solder 213 may be any bonding material generally used, and in particular, the solder 213 used in the first exemplary embodiment of the present disclosure may be in the form of a paste containing 90% or more of tin (Sn).

Since the solder 213 used in the first exemplary embodiment of the present disclosure is in the form of a paste containing 90% or more of tin (Sn), the effect of aligning the multilayer ceramic capacitor disposed on the upper portion of the ceramic chip 200 in the central portion of the composite body 300 may be maximized by the surface tension generated while melting the solder 213 at a predetermined temperature or higher.

According to the first exemplary embodiment of the present disclosure, a difference (C1-C2) between a distance (C1) from a central portion of the composite body 300 to inner ends of bent portions of the first and second external electrodes 131 and 132 disposed on a lower surface of the first ceramic body 110 and a distance (C2) from the central portion of the composite body 300 to the inner ends of the bent portions of the first and second terminal electrodes 231 and 232 disposed on an upper surface of the second ceramic body 210, and a distance (G1) from which the first ceramic body 110 and the second ceramic body 210 are spaced apart from each other in a thickness direction, may satisfy (C1-C2)>G1.

The difference (C1-C2) between the distance (C1) from the central portion of the composite body 300 to the inner ends of the bent portions of the first and second external electrodes 131 and 132 disposed on the lower surface of the first ceramic body 110 and the distance (C2) from the central portion of the composite body 300 to the inner ends of the bent portions of the first and second terminal electrodes 231 and 232 disposed on the upper surface of the second ceramic body 210, and the distance (G1) from which the first ceramic body 110 and the second ceramic body 210 are spaced apart from each other in the thickness direction, may be controlled to satisfy (C1-C2)>G1, to increase the surface tension generated while melting the solder 213. Therefore, the multilayer ceramic capacitor may be stably aligned in the central portion without being distorted.

When the difference (C1-C2) between the distance (C1) from the central portion of the composite body 300 to the inner ends of the bent portions of the first and second external electrodes 131 and 132 disposed on the lower surface of the first ceramic body 110 and the distance (C2) from the central portion of the composite body 300 to the inner ends of the bent portions of the first and second terminal electrodes 231 and 232 disposed on the upper surface of the second ceramic body 210, is equal to or less than the distance (G1) from which the first ceramic body 110 and the second ceramic body 210 are spaced apart from each other in the thickness direction, the multilayer ceramic capacitor disposed on the ceramic chip may be distorted, without increasing the surface tension generated by the solder.

As such, when the multilayer ceramic capacitor disposed on the ceramic chip is disposed in a distorted state, problems may occur in reducing the acoustic noise, and failures may occur in mounting the composite electronic component.

In addition, a distance (X) from outermost ends of the first and second terminal electrodes 231 and 232 to the respective inner ends of the bent portions of the first and second terminal electrodes 231 and 232 disposed on an upper surface of the second ceramic body 210, and a distance (G) between both inner ends of the bent portions of the first and second terminal electrodes 231 and 232 disposed on the upper surface of the second ceramic body 210, may satisfy 2X>G.

The distance (X) from the outermost ends of the first and second terminal electrodes 231 and 232 to the respective inner ends of the bent portions of the first and second terminal electrodes 231 and 232 disposed on the upper surface of the second ceramic body 210, and the distance (G) between both inner ends of the bent portions of the first and second terminal electrodes 231 and 232 disposed on the upper surface of the second ceramic body 210, may be controlled to satisfy 2X>G, to stably align the multilayer ceramic capacitor in the central portion without being distorted.

When the distance (X) from the outermost ends of the first and second terminal electrodes 231 and 232 to the respective inner ends of the bent portions of the first and second terminal electrodes 231 and 232 disposed on the upper surface of the second ceramic body 210, and the distance (G) between both inner ends of the bent portions of the first and second terminal electrodes 231 and 232 disposed on the upper surface of the second ceramic body 210, satisfy 2X≤G, failures may occur in mounting the composite electronic component.

According to the first exemplary embodiment of the present disclosure, a distance (M) between both inner ends of bent portions of the first and second external electrodes 131 and 132 disposed on an upper surface of the first ceramic body 110, and a distance (G) between both inner ends of the bent portions of the first and second terminal electrodes 231 and 232 disposed on the upper surface of the second ceramic body 210, may satisfy M>G.

The distance (M) between both inner ends of the bent portions of the first and second external electrodes 131 and 132 disposed on the upper surface of the first ceramic body 110, and the distance (G) between both inner ends of the bent portions of the first and second terminal electrodes 231 and 232 disposed on the upper surface of the second ceramic body 210, may be controlled to satisfy M>G, to stably align the multilayer ceramic capacitor in the central portion without being distorted.

When the distance (M) between both inner ends of the bent portions of the first and second external electrodes 131 and 132 disposed on the upper surface of the first ceramic body 110, and the distance (G) between both inner ends of the bent portions of the first and second terminal electrodes 231 and 232 disposed on the upper surface of the second ceramic body 210, satisfy M≤G, failures may occur in mounting the composite electronic component.

In addition, a length (L1) of the multilayer ceramic capacitor 100 in a length direction and a length (L2) of the ceramic chip in the length direction may satisfy L1≥L2.

The length (L1) of the multilayer ceramic capacitor 100 in the length direction and the length (L2) of the ceramic chip in the length direction may be controlled to satisfy L1≥L2. Therefore, the terminal electrode of the ceramic chip may be located closer to the central portion of the composite electronic component than the external electrode of the multilayer ceramic capacitor based on the central portion of the composite electronic component, and surface tension may be generated while melting the solder paste bonding the multilayer ceramic capacitor and the ceramic chip at a predetermined temperature or higher, to maximize the effect of the alignment of the multilayer ceramic capacitor disposed on the upper portion.

When the length (L1) of the multilayer ceramic capacitor 100 in the length direction is less than the length (L2) of the ceramic chip in the length direction, the multilayer ceramic capacitor disposed on the ceramic chip may be distorted.

As such, when the multilayer ceramic capacitor disposed on the ceramic chip is disposed in a distorted state, problems may occur in reducing the acoustic noise, and failures may occur in mounting the composite electronic component.

According to the first exemplary embodiment of the present disclosure, a distance (C1) from a central portion of the composite body 300 to inner ends of bent portions of the first and second external electrodes 131 and 132 disposed on a lower surface of the first ceramic body 110 and a distance (C2) from the central portion of the composite body 300 to the inner ends of the bent portions of the first and second terminal electrodes 231 and 232 disposed on an upper surface of the second ceramic body 210 may satisfy C1≥C2.

The distance (C1) from the central portion of the composite body 300 to the inner ends of the bent portions of the first and second external electrodes 131 and 132 disposed on the lower surface of the first ceramic body 110 and the distance (C2) from the central portion of the composite body 300 to the inner ends of the bent portions of the first and second terminal electrodes 231 and 232 disposed on the upper surface of the second ceramic body 210 may be controlled to satisfy C1≥C2, to stably align the multilayer ceramic capacitor in the central portion without being distorted.

When the distance (C1) from the central portion of the composite body 300 to the inner ends of the bent portions of the first and second external electrodes 131 and 132 disposed on the lower surface of the first ceramic body 110 is less than the distance (C2) from the central portion of the composite body 300 to the inner ends of the bent portions of the first and second terminal electrodes 231 and 232 disposed on the upper surface of the second ceramic body 210, the multilayer ceramic capacitor disposed on the ceramic chip may be distorted.

As such, when the multilayer ceramic capacitor disposed on the ceramic chip is disposed in a distorted state, problems may occur in reducing the acoustic noise, and failures may occur in mounting the composite electronic component.

Hereinafter, the multilayer ceramic capacitor 100 and the ceramic chip 200 constituting the composite body 300 will be described in detail.

Referring to FIG. 2, the first ceramic body 110 constituting the multilayer ceramic capacitor 100 may be formed by stacking the plurality of dielectric layers 111, and a plurality of internal electrodes 121 and 122 (first and second internal electrodes in sequence) may be arranged in the first ceramic body 110 to be spaced apart from each other with each of the dielectric layers 111 interposed therebetween.

The plurality of dielectric layers 111 forming the first ceramic body 110 may be in a sintered state, and adjacent dielectric layers may be integrated with each other so that boundaries therebetween are not readily apparent.

The dielectric layer 111 may be formed by sintering a ceramic green sheet including ceramic powder particles, an organic solvent, and an organic binder. As the ceramic powder particles, a material having a high dielectric constant, a barium titanate ($BaTiO_3$) based material, a strontium titanate ($SrTiO_3$) based material, or the like, may be used, but is not limited thereto.

For example, the dielectric layers 111 constituting the first ceramic body 110 may include a ferroelectric material, but are not necessarily limited thereto.

According to the first exemplary embodiment of the present disclosure, the internal electrodes may include first internal electrodes 121 exposed from the first side surface of the composite body 300 in the length direction, and second internal electrodes 122 exposed from the second side surface thereof in the length direction, but are not necessarily limited thereto.

The first and second internal electrodes 121 and 122 may be formed of a conductive paste including a conductive metal.

The conductive metal may be nickel (Ni), copper (Cu), palladium (Pd), or alloys thereof, but is not limited thereto.

The first and second internal electrodes 121 and 122 may be printed on the ceramic green sheets forming the dielectric layers 111, using the conductive paste by a printing method such as a screen-printing method or a gravure printing method.

The ceramic green sheets on which the internal electrodes are printed may be stacked and sintered to form the first ceramic body 110.

The plurality of first and second internal electrodes 121 and 122 may be disposed to be perpendicular to upper and lower surfaces of the first ceramic body 110.

In addition, the first and second external electrodes 131 and 132 may be formed of a conductive paste including a conductive metal. In this case, the conductive metal may be nickel (Ni), copper (Cu), palladium (Pd), gold (Au), or alloys thereof, but is not limited thereto.

In addition, nickel/tin (Ni/Sn) plating layers may be further disposed on the first and second external electrodes 131 and 132.

According to the first exemplary embodiment of the present disclosure, the ceramic chip 200 may be coupled to the lower portion of the multilayer ceramic capacitor 100, and may be disposed under the multilayer ceramic capacitor 100.

The ceramic chip 200 may have a shape in which the first and second terminal electrodes 231 and 232 connected to the first and second external electrodes 131 and 132, respectively, are disposed, respectively, on the opposite end portions of the ceramic body 210 formed of ceramic having a bulk form.

Generally, there has been an attempt to insert an intermediate medium between a multilayer ceramic capacitor and a printed circuit board in order to significantly suppress vibrations of the multilayer ceramic capacitor from being transferred to the printed circuit board.

However, the intermediate medium, generally a resin used to manufacture the printed circuit board, is formed of a material having elasticity, and thus serves to absorb the vibrations of the multilayer ceramic capacitor by the elasticity of the intermediate medium.

According to the first exemplary embodiment of the present disclosure, since the second ceramic body 210 of the ceramic chip 200 is formed of only ceramic including a hard material that is not elastically deformed, the printed circuit board and the multilayer ceramic capacitor 100 may be spaced apart from each other by the ceramic chip 200. Therefore, the transfer of vibrations themselves generated from the multilayer ceramic capacitor 100 may be blocked.

According to the first exemplary embodiment of the present disclosure, the ceramic may include alumina ($Al_2O_3$).

Since the alumina ($Al_2O_3$) does not have piezoelectric characteristics, the alumina ($Al_2O_3$) may suppress the transfer of vibrations themselves generated from the multilayer ceramic capacitor 100. Therefore, the ceramic chip 200 including the alumina ($Al_2O_3$) may be disposed below the multilayer ceramic capacitor 100 to decrease the acoustic noise.

The first and second terminal electrodes 231 and 232 may have, for example, double layer structures including first and second conductive resin layers disposed at an inner side and first and second plating layers disposed at an outer side, respectively, but are not particularly limited thereto.

According to the first exemplary embodiment of the present disclosure, as described above, since the first and second terminal electrodes 231 and 232 have the double layer structures including the first and second conductive resin layers disposed at the inner side and the first and second plating layers disposed at the outer side, respectively, when mechanical stress is applied from an external source, the transfer of the stress to the multilayer ceramic capacitor 100 may be suppressed by the ceramic chip 200 and the conductive resin layers used as the terminal electrodes 231 and 232 of the ceramic chip 200, such that damage due to a crack of the multilayer ceramic capacitor may be prevented.

Each of the first and second conductive resin layers may include a conductive metal and a thermosetting resin, and may include, for example, silver (Ag) and an epoxy resin, but are not limited thereto.

In the multilayer ceramic capacitor according to the first exemplary embodiment of the present disclosure, the plurality of first and second internal electrodes 121 and 122 may be disposed perpendicularly to the upper and lower surfaces of the first ceramic body 110.

For example, the first and second internal electrodes 121 and 122 may be stacked perpendicularly to amounting surface at the time of mounting the composite body 300 on the printed circuit board.

Generally, when a voltage is applied to the multilayer ceramic capacitor, the ceramic body may be repeatedly expanded and contracted in the length, width and thickness directions by an inverse piezoelectric effect of the dielectric layers.

For example, when displacement amounts of a length-width surface (an L-W surface), a width-thickness surface (a W-T surface), and a length-thickness surface (an L-T surface) of the ceramic body are measured by a laser Doppler vibrometer (LDV), the displacement amounts may appear in a sequence of L-W surface>W-T surface>L-T surface.

The displacement amount of the L-T surface, about 42% of that of the W-T surface, may be smaller than that of the W-T surface. Therefore, it may be seen that stress having the same magnitude is generated in the L-T surface and the W-T surface, but particularly, the L-T surface has an area relatively greater than that of the W-T surface, and stress having a similar magnitude is thus distributed over a wide area of the L-T surface, such that a relatively low amount of deformation is generated in the L-T surface.

Therefore, it may be seen that the displacement amount of the L-T surface in a general multilayer ceramic capacitor is the smallest.

For example, according to the first exemplary embodiment of the present disclosure, the first and second internal electrodes 121 and 122 may be stacked perpendicular to the upper and lower surfaces of the first ceramic body 110, such that the first and second internal electrodes 121 and 122 may be disposed perpendicular to the mounting surface at the time of mounting the composite body 300 on the printed circuit board, and a vibration amount of a surface in contact with the ceramic chip 200 may be significantly decreased.

Figure 4:
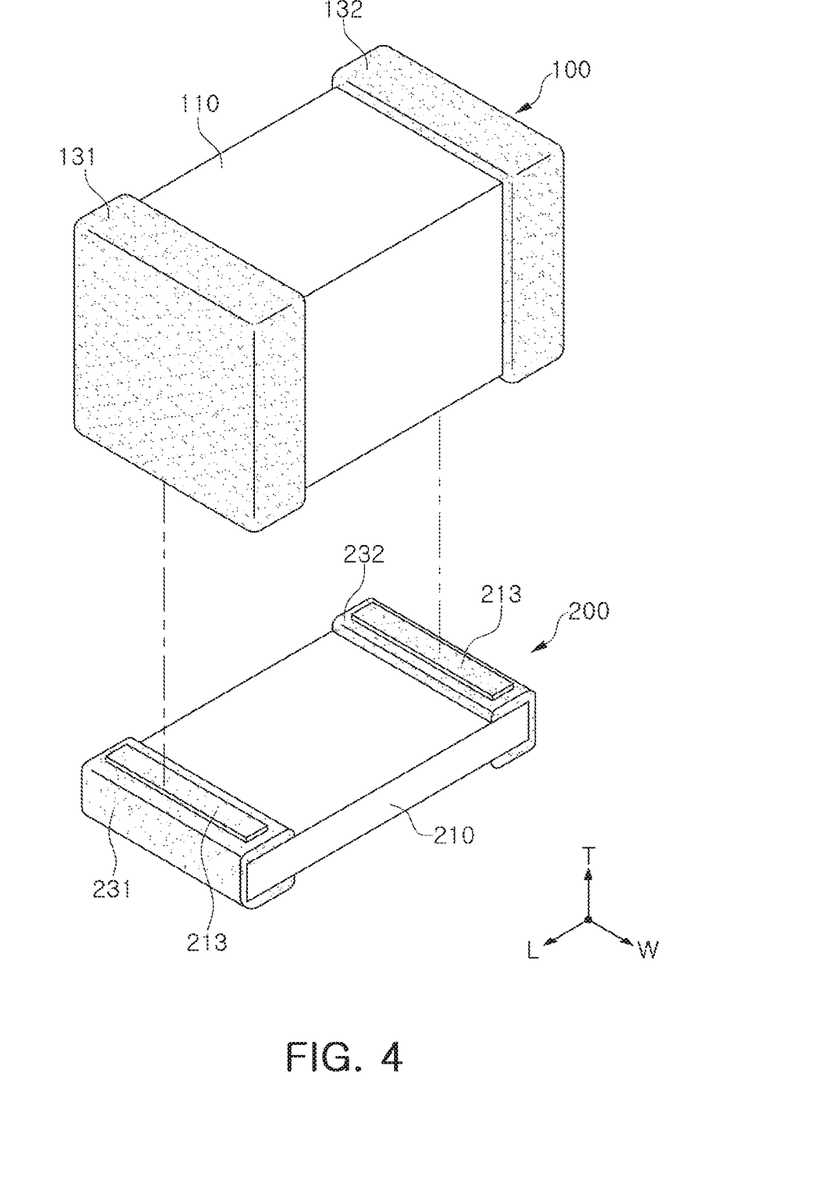
FIG. 4 is an exploded perspective view illustrating a multilayer ceramic capacitor and a ceramic chip of the composite electronic component of FIG. 1.

FIG. 4 is an exploded perspective view illustrating a multilayer ceramic capacitor and a ceramic chip of the composite electronic component of FIG. 1.

The composite body 300 may be formed by coupling the multilayer ceramic capacitor 100 and the ceramic chip 200 to each other. However, a method of forming the composite body 300 is not particularly limited.

The composite body 300 may be formed by coupling the multilayer ceramic capacitor 100 and the ceramic chip 200 that are separately manufactured to each other by the solder 213, a conductive adhesive, or the like.

Referring to FIG. 4, when the multilayer ceramic capacitor 100 and the ceramic chip 200 are coupled to each other through the solder 213, a conductive adhesive, or the like, the solder 213 may be applied to the upper surfaces of the first and second terminal electrodes 231 and 232 to bond the first and second terminal electrodes 231 and 232 and the first and second external electrodes 131 and 132 of the multilayer ceramic capacitor 100, respectively.

The solder 213 or the conductive adhesive may be applied to the upper surfaces of the first and second terminal electrodes 231 and 232 to fix the ceramic chip 200 and the multilayer ceramic capacitor 100 to each other and thus allow only vibrations of a length-width surface (a L-W surface) of the first ceramic body 110 to be transferred to the ceramic chip 200.

Therefore, the stress and the vibrations generated from the multilayer ceramic capacitor may be significantly suppressed from being transferred to the ceramic chip, to decrease acoustic noise.

A composite electronic component according to a second exemplary embodiment of the present disclosure may include a composite body 300 formed by coupling a multilayer ceramic capacitor 100 and a ceramic chip 200 to each other, the multilayer ceramic capacitor 100 including a first ceramic body 110 in which a plurality of dielectric layers 111 and internal electrodes 121 and 122 disposed to face each other with each of the dielectric layers 111 are stacked, and first and second external electrodes 131 and 132 disposed on opposite end portions of the first ceramic body 110, respectively, and the ceramic chip 200 being disposed below the multilayer ceramic capacitor 100 and including a second ceramic body 210 including ceramic and first and second terminal electrodes 231 and 232 disposed on opposite end portions of the second ceramic body 210, respectively, and connected to the first and second external electrodes 131 and 132, respectively, wherein a difference (C1−C2) between a distance (C1) from a central portion of the composite body 300 to inner ends of bent portions of the first and second external electrodes 131 and 132 disposed on a lower surface of the first ceramic body 110 and a distance (C2) from the central portion of the composite body 300 to inner ends of bent portions of the first and second terminal electrodes 231 and 232 disposed on an upper surface of the second ceramic body 210, and a distance (G1) from which the first ceramic body 110 and the second ceramic body 210 are spaced apart from each other in a thickness direction, may satisfy (C1−C2)>G1.

The difference (C1−C2) between the distance (C1) from the central portion of the composite body 300 to the inner ends of the bent portions of the first and second external electrodes 131 and 132 disposed on the lower surface of the first ceramic body 110 and the distance (C2) from the central portion of the composite body 300 to the inner ends of the bent portions of the first and second terminal electrodes 231 and 232 disposed on the upper surface of the second ceramic body 210, and the distance (G1) from which the first ceramic body 110 and the second ceramic body 210 are spaced apart from each other in the thickness direction, may be controlled to satisfy (C1−C2)>G1, to increase the surface tension generated while melting the solder 213. Therefore, the multilayer ceramic capacitor may be stably aligned in the central portion without being distorted.

When the difference (C1−C2) between the distance (C1) from the central portion of the composite body 300 to the inner ends of the bent portions of the first and second external electrodes 131 and 132 disposed on the lower surface of the first ceramic body 110 and the distance (C2) from the central portion of the composite body 300 to the inner ends of the bent portions of the first and second terminal electrodes 231 and 232 disposed on the upper surface of the second ceramic body 210, is equal to or less than the distance (G1) from which the first ceramic body 110 and the second ceramic body 210 are spaced apart from each other in the thickness direction, the multilayer ceramic capacitor disposed on the ceramic chip may be distorted, without increasing the surface tension generated by the solder.

As such, when the multilayer ceramic capacitor disposed on the ceramic chip is disposed in a distorted state, problems may occur in reducing the acoustic noise, and failures may occur in mounting the composite electronic component.

In addition, among the features of the composite electronic component according to the second exemplary embodiment of the present disclosure, the same portions as those of the composite electronic component according to the first exemplary embodiment of the present disclosure described above will be omitted in order to avoid redundant description.

A method for manufacturing a composite electronic component according to an exemplary embodiment of the present disclosure may satisfy a range for each position, and may be implemented by coupling the multilayer ceramic capacitor 100, separately manufactured, and the ceramic chip 200 using the solder 213, a conductive adhesive, or the like. The bonding method may be performed according to a conventional method, but the present disclosure is not limited thereto.

According to an exemplary embodiment of the present disclosure, stress or vibrations depending on piezoelectric characteristics of the multilayer ceramic capacitor may be alleviated by the ceramic chip, such that acoustic noise generated from the circuit board may be decreased.

In particular, the terminal electrode of the ceramic chip may be located closer to the central portion of the composite electronic component than the external electrode of the multilayer ceramic capacitor based on the central portion of the composite electronic component, and surface tension may be generated while melting the solder paste coupling the multilayer ceramic capacitor and the ceramic chip at a predetermined temperature or higher, to maximize the effect of the alignment of the multilayer ceramic capacitor disposed on the upper portion of the composite electronic component.

In addition, the internal electrodes of the multilayer ceramic capacitor may be stacked in a direction perpendicular to the mounting surface, and a surface of the multilayer ceramic capacitor in a length-width direction of which a piezoelectric displacement amount is small may be coupled to the ceramic chip to significantly suppress the stress and the vibrations generated from the multilayer ceramic capacitor from being transferred to the ceramic chip, such that the acoustic noise may be decreased.

While exemplary embodiments have been illustrated and described above, it will be apparent to those skilled in the art that modifications and variations could be made without departing from the scope of the present disclosure as defined by the appended claims.

What is claimed is:

1. A composite electronic component comprising:
a composite body including a multilayer ceramic capacitor and a ceramic chip coupled to each other,
wherein the multilayer ceramic capacitor includes a first ceramic body having a plurality of dielectric layers and internal electrodes, stacked to face each other with the respective dielectric layers interposed therebetween, and further includes first and second external electrodes disposed on opposite end portions of the first ceramic body, respectively, in a first direction,
wherein the ceramic chip is disposed below a lower surface of the first ceramic body of the multilayer ceramic capacitor in a second direction and includes a second ceramic body and first and second terminal electrodes disposed on opposite end portions of the second ceramic body, respectively, in the first direction and connected to the first and second external electrodes, respectively,
wherein solder is arranged between the first external electrode and the first terminal electrode and between the second external electrode and the second terminal electrode such that the multilayer ceramic capacitor and the ceramic chip are coupled,
wherein the solder includes first portions respectively disposed on inner ends of bent portions of the first and second terminal electrodes disposed on an upper surface of the second ceramic body facing the lower surface of the first ceramic body, and
wherein each angle (θ) defined by inner sider surfaces of the first portions of the solder and the upper surface of the second ceramic body satisfies 45 degrees or less.

2. The composite electronic component according to claim 1, wherein, when 'C1' is a distance in the first direction from a central plane of the composite body to inner ends of bent portions of the first and second external electrodes disposed on the lower surface of the first ceramic body, 'C2' is a distance in the first direction from the central plane of the composite body to the inner ends of the bent portions of the first and second terminal electrodes disposed on the upper surface of the second ceramic body, and 'G1' is a gap between the first ceramic body and the second ceramic body in the second direction, (C1−C2)>G1.

3. The composite electronic component according to claim 1, wherein, when 'X' is a distance in the first direction from outermost ends of the first and second terminal electrodes to the respective inner ends of the bent portions of the first and second terminal electrodes, and 'G' is a distance in the first direction between both of the inner ends of the bent portions of the first and second terminal electrodes, 2X>G.

4. The composite electronic component according to claim 1, wherein, when 'M' is a distance in the first direction between both of inner ends of bent portions of the first and second external electrodes disposed on an upper surface of the first ceramic body opposite the lower surface of the first ceramic body, and 'G' is a distance in the first direction between both of the inner ends of the bent portions of the first and second terminal electrodes disposed on the upper surface of the second ceramic body, M>G.

5. The composite electronic component according to claim 1, wherein, when 'L1' is a length of the multilayer ceramic capacitor in the first direction and 'L2' is a length of the ceramic chip in the first direction, L1≥L2.

6. The composite electronic component according to claim 1, wherein, when 'C' is a distance in the first direction from a central plane of the composite body to inner ends of bent portions of the first and second external electrodes disposed on the lower surface of the first ceramic body, and 'C2' is a distance in the first direction from the central plane of the composite body to the inner ends of the bent portions of the first and second terminal electrodes disposed on the upper surface of the second ceramic body, C1≥C2.

7. The composite electronic component according to claim 1, wherein the internal electrodes of the first ceramic body are stacked perpendicularly to a mounting surface of the composite body.

8. The composite electronic component according to claim 1, wherein the second ceramic body is made of a ceramic material which includes only alumina ($Al_2O_3$).

9. A composite electronic component comprising:
a composite body including a multilayer ceramic capacitor and a ceramic chip coupled to each other,
wherein the multilayer ceramic capacitor includes a first ceramic body having a plurality of dielectric layers and internal electrodes, stacked to face each other with the respective dielectric layers interposed therebetween, and further includes first and second external electrodes disposed on opposite end portions of the first ceramic body, respectively, in a first direction, and
wherein the ceramic chip is disposed below a lower surface of the first ceramic body of the multilayer ceramic capacitor in a second direction perpendicular to the first direction and includes a second ceramic body and first and second terminal electrodes disposed on opposite end portions of the second ceramic body, respectively, in the first direction and connected to the first and second external electrodes, respectively,
wherein, when 'C1' is a distance in the first direction from a central plane of the composite body to inner ends of bent portions of the first and second external electrodes disposed on the lower surface of the first ceramic body, 'C2' is a distance (C2) in the first direction from the central plane of the composite body to inner ends of bent portions of the first and second terminal electrodes disposed on an upper surface of the second ceramic body facing the lower surface of the first ceramic body, and 'G1' is a gap between the first ceramic body and the second ceramic body in the second direction, (C1−C2)>G1.

10. The composite electronic component according to claim 9, wherein solder is arranged between the first external electrode and the first terminal electrode and between the second external electrode and the second terminal electrode such that the multilayer ceramic capacitor and the ceramic chip are coupled,
wherein the solder includes first portions respectively disposed on the inner ends of the bent portions of the first and second terminal electrodes disposed on the upper surface of the second ceramic body, and
wherein each angle (θ) defined by inner sider surfaces of the first portions of the solder and the upper surface of the second ceramic body satisfies 45 degrees or less.

11. The composite electronic component according to claim 9, wherein, when 'X' is a distance in the first direction from outermost ends of the first and second terminal electrodes to the respective inner ends of the bent portions of the first and second terminal electrodes disposed on the upper surface of the second ceramic body, and 'G' is a distance in the first direction between both of the inner ends of the bent portions of the first and second terminal electrodes disposed on the upper surface of the second ceramic body, 2X>G.

12. The composite electronic component according to claim 9, wherein, when 'M' is a distance in the first direction between both of the inner ends of the bent portions of the first and second external electrodes disposed on an upper surface of the first ceramic body opposite the lower surface of the first ceramic body, and 'G' is a distance in the first direction between both of the inner ends of the bent portions of the first and second terminal electrodes disposed on the upper surface of the second ceramic body, M>G.

13. The composite electronic component according to claim 9, wherein, when 'L1' is a length of the multilayer ceramic capacitor in the first direction and 'L2' is a length of the ceramic chip in the first direction, L1≥L2.

14. The composite electronic component according to claim 9, wherein C1≥C2.

15. The composite electronic component according to claim 9, wherein the internal electrodes of the first ceramic body are stacked perpendicularly to a mounting surface of the composite body.

16. The composite electronic component according to claim 9, wherein the second ceramic body is made of a ceramic material which includes only alumina ($Al_2O_3$).

* * * * *